United States Patent
Park et al.

(10) Patent No.: US 12,178,016 B2
(45) Date of Patent: Dec. 24, 2024

(54) INTEGRATED CONTROLLER AND VEHICLE INCLUDING THE SAME

(71) Applicants: Hyundai Motor Company, Seoul (KR); Kia Corporation, Seoul (KR); Hyundai Autron Co., Ltd., Seongnam-si (KR)

(72) Inventors: Jae Yong Park, Suwon-si (KR); Jong-Yoon Yee, Seoul (KR); Bong Ju Kim, Yongin-si (KR)

(73) Assignees: HYUNDAI MOTOR COMPANY, Seoul (KR); KIA CORPORATION, Seoul (KR); HYUNDAI AUTOEVER CORP., Seoul (KR)

(*) Notice: Subject to any disclaimer, the term of this patent is extended or adjusted under 35 U.S.C. 154(b) by 0 days.

(21) Appl. No.: 18/146,838

(22) Filed: Dec. 27, 2022

(65) Prior Publication Data

US 2023/0137075 A1 May 4, 2023

Related U.S. Application Data

(62) Division of application No. 16/421,123, filed on May 23, 2019, now Pat. No. 11,564,333.

(30) Foreign Application Priority Data

Dec. 18, 2018 (KR) .................. 10-2018-0164120

(51) Int. Cl.
| | |
|---|---|
| *H05K 7/20* | (2006.01) |
| *B60H 1/00* | (2006.01) |
| *F24F 11/74* | (2018.01) |
| *H05K 7/14* | (2006.01) |

(Continued)

(52) U.S. Cl.
CPC ..... *H05K 7/20409* (2013.01); *B60H 1/00021* (2013.01); *F24F 11/74* (2018.01); *H05K 7/1407* (2013.01); *H05K 7/20454* (2013.01); *B60H 2001/0015* (2013.01); *F24F 2120/20* (2018.01); *G05B 11/06* (2013.01)

(58) Field of Classification Search
CPC ........... H05K 7/20154; H05K 7/20418; H05K 7/20863; B60H 1/00671; B60H 1/00328
See application file for complete search history.

(56) References Cited

U.S. PATENT DOCUMENTS

| | | | |
|---|---|---|---|
| 9,642,286 B1* | 5/2017 | Gutierrez | ........... H05K 7/20736 |
| 10,926,604 B2 | 2/2021 | Kobayashi et al. | |
| 11,242,068 B2 | 2/2022 | Choi et al. | |

(Continued)

FOREIGN PATENT DOCUMENTS

| | | |
|---|---|---|
| CN | 106712126 A | 5/2017 |
| CN | 108216219 A | 6/2018 |

(Continued)

*Primary Examiner* — Nelson J Nieves
*Assistant Examiner* — Meraj A Shaikh
(74) *Attorney, Agent, or Firm* — SLATER MATSIL, LLP (57) ABSTRACT

An integrated controller can be equipped with an advanced driver assistance system (ADAS) of a vehicle. The integrated controller includes a printed circuit board, a housing of a heat dissipation fin structure positioned to surround the at least one printed circuit board, a thermal grease provided on a surface of the printed circuit board and on a surface of the housing, and a bolt fastening portion connecting the printed circuit board to the housing.

18 Claims, 9 Drawing Sheets

(51) Int. Cl.
 *F24F 120/20* (2018.01)
 *G05B 11/06* (2006.01)

(56) References Cited

U.S. PATENT DOCUMENTS

| | | |
|---|---|---|
| 2011/0083449 A1 | 4/2011 | Louch et al. |
| 2016/0186648 A1* | 6/2016 | Rollinger .............. G01F 23/804 |
| | | 73/290 R |
| 2018/0173224 A1 | 6/2018 | Kim |
| 2018/0266646 A1 | 9/2018 | Sanchez et al. |
| 2018/0310396 A1* | 10/2018 | Kobayashi ......... H05K 7/20918 |
| 2018/0326818 A1 | 11/2018 | Hong et al. |
| 2018/0334948 A1* | 11/2018 | Rollinger .................. F01P 11/18 |
| 2020/0307348 A1* | 10/2020 | Kobayashi ......... B60H 1/00328 |
| 2020/0361482 A1* | 11/2020 | Choi ...................... B60W 40/08 |
| 2021/0185795 A1* | 6/2021 | Toyama ............. H05K 7/20854 |

FOREIGN PATENT DOCUMENTS

| | | | |
|---|---|---|---|
| CN | 108626695 A | | 10/2018 |
| CN | 208638836 U | * | 3/2019 |
| DE | 102010037907 A1 | | 4/2011 |
| DE | 102011005733 A1 | | 12/2011 |
| JP | 2014034271 A | | 2/2014 |
| JP | 2019033168 A | * | 2/2019 |
| KR | 19980701642 A | | 6/1998 |
| KR | 20070006146 A | | 1/2007 |
| KR | 20160057106 A | | 5/2016 |
| KR | 20170057027 A | | 5/2017 |
| KR | 20180073263 A | | 7/2018 |
| WO | 2017209313 A1 | | 12/2017 |
| WO | 2017221460 A1 | | 12/2017 |

\* cited by examiner

INTEGRATED CONTROLLER AND VEHICLE INCLUDING THE SAME

CROSS-REFERENCE TO RELATED APPLICATIONS

This application is a division of U.S. application Ser. No. 16/421,123, filed on May 23, 2019, which claims priority to Korean Patent Application No. 10-2018-0164120, filed in the Korean Intellectual Property Office on Dec. 18, 2018, which application is hereby incorporated herein by reference.

TECHNICAL FIELD

Embodiments of the present disclosure relate to an integrated controller, a vehicle including the same and a method of controlling the vehicle.

BACKGROUND

In general, a vehicle is transport means that runs on a road or a track to transport humans or objects to desired places. The vehicle moves by one or more wheels generally installed in the vehicle body. Examples of the vehicle include a three-wheeled vehicle, a four-wheeled vehicle, a two-wheeled vehicle such as a motorcycle, construction equipment, a bicycle, and a train running on a track.

Recently, studies into vehicles with Advanced Driver Assist System (ADAS) for actively providing information about vehicle states, a driver's states, and surrounding environments in order to reduce the driver's load and improve convenience are actively conducted.

As examples of ADAS mounted on vehicles, there are forward collision avoidance (FCA) system, autonomous emergency brake (AEB) system, and driver attention warning (DAW) system. The systems are collision avoidance and warning systems for determining the risk of collision with an object when vehicles are driven and performing emergency braking when the risk of collision with the object is determined.

In particular, an integrated controller of ADAS is being developed in which a high-performance application processor (AP) or field-programmable gate array (FPGA) chips are added to typical electronic units to apply sensor fusion and deep-running image recognition technology by installing various sensors for operating the ADAS.

However, the integrated controller with various chips generates heat upon operation. Therefore, studies for minimizing heat generation and securing effective heat dissipation performance are underway.

SUMMARY

Embodiments of the present disclosure relate to an integrated controller, a vehicle including the same and a method of controlling the vehicle. Particular embodiments relate to a vehicle having a way of securing the heat dissipation performance of an integrated controller, and a method of controlling the vehicle.

It is an aspect of the present disclosure to provide a vehicle of reducing the heat generation of an integrated controller equipped with an Advanced Driver Assist System (ADAS), and a method of controlling the vehicle.

It is another aspect of the present disclosure to provide a vehicle having a way of preventing a temperature of an integrated controller equipped with an ADAS from falling excessively, and a method of controlling the vehicle.

Accordingly, the integrated controller equipped with the ADAS, the ADAS mounted on the vehicle, may be provided as a structure that is operable in such a way not to be sensitive to an external temperature.

Additional aspects of the disclosure will be set forth in part in the description which follows and, in part, will be obvious from the description, or may be learned by practice of the disclosure.

In accordance with an aspect of the present disclosure, an integrated controller is equipped with an advanced driver assistance system (ADAS) for a vehicle. The integrated controller includes at least one printed circuit board, a housing of a heat dissipation fin structure positioned to surround the printed circuit board, a thermal grease provided on at least a part of a surface of the at least one printed circuit board and at least a part of a surface of the housing, and a bolt fastening portion connecting the at least one printed circuit board to the housing.

The housing may include a cover housing and a base housing. The printed circuit board is positioned in the inside of at least one of the cover housing and the base housing. The thermal grease may be positioned between the printed circuit board and the housing.

The heat dissipation fin structure may protrude from at least one surface of an upper portion of the cover housing, and protrude from at least one surface of a lower portion of the base housing.

In accordance with another aspect of the present disclosure, a vehicle includes an integrated controller equipped with an advanced driver assistance system (ADAS). An air conditioner is configured to introduce air into the inside of the vehicle and to adjust a flow of the air. The air conditioner is configured to transmit the air to the integrated controller by branching an air conditioning duct which is a passage for transmitting air into the inside of the vehicle.

The integrated controller may measure a temperature of the integrated controller, calculate a value of a heat capacity that needs to be dissipated when it is determined that heat dissipation of the integrated controller is needed, and transmit the calculated value of the heat capacity to the air conditioner.

The air conditioner may further include an air conditioning switch configured to receive an air conditioning control value from a driver, a flow control valve configured to adjust an amount of air that is transmitted to the integrated controller, and an air conditioning controller configured to control the flow control valve.

The air conditioning controller may receive the value of the heat capacity calculated by the integrated controller and calculate a final heat capacity value based on the received value of the heat capacity and the air conditioning control value received from the driver.

The air conditioning controller may compensate for the air conditioning control value when the final heat capacity value is larger than a reference value, and open the flow control valve when the final heat capacity value is smaller than the reference value.

The reference value may be the air conditioning control value received from the driver, and be a threshold value allowing internal air conditioning control of the vehicle.

The air conditioning control value may further include a setting temperature set by the driver or a setting air volume set by the driver. The air conditioning controller may decrease the setting temperature or increase the setting air volume when the final heat capacity value is larger than the reference value.

The air conditioner may transmit cooled air or heated air to the integrated controller by branching an air conditioning duct which is a passage for transmitting air into the inside of the vehicle.

When it is determined that heating of the integrated controller is needed, the integrated controller may calculate a value of a heat capacity required for heating and transmit the calculated value of the heat capacity to the air conditioner.

The air conditioner may calculate the final heat capacity value based on the received value of the heat capacity and the air conditioning control value, and heat the air conditioner based on the final heat capacity value.

In accordance with another aspect of the present disclosure, a method for controlling a vehicle includes introducing air into the inside of the vehicle or adjusting a flow of the air by an air conditioner, operating an integrated controller equipped with an advanced driver assistance system (ADAS), and transmitting the air to the integrated controller through a branched air conditioning duct which is a passage for transmitting air into the inside of the vehicle.

The method may further include measuring a temperature of the integrated controller, calculating a value of a heat capacity that needs to be dissipated when it is determined that heat dissipation of the integrated controller is needed, and transmitting the calculated value of the heat capacity to the air conditioner.

The method may further include receiving an air conditioning control value from a driver.

The method may further include receiving the value of the heat capacity calculated by the integrated controller and calculating a final heat capacity value based on the received value of the heat capacity and the air conditioning control value.

The method may further include compensating for the air conditioning control value when the final heat capacity value is larger than a reference value, and opening the flow control valve when the final heat capacity value is smaller than the reference value.

The reference value may be the air conditioning control value received from the driver, and be a threshold value allowing internal air conditioning control of the vehicle.

The air conditioning control value may further include a setting temperature set by the driver or a setting air volume set by the driver, wherein the compensating of the air conditioning control value when the final heat capacity value is larger than the reference value and the opening of the flow control valve when the final heat capacity value is smaller than the reference value further comprises decreasing the setting temperature or increasing the setting air volume when the final heat capacity value is larger than the reference value.

BRIEF DESCRIPTION OF THE DRAWINGS

These and other aspects of the disclosure will become apparent and more readily appreciated from the following description of the embodiments, taken in conjunction with the accompanying drawings of which.

DETAILED DESCRIPTION OF ILLUSTRATIVE EMBODIMENTS

Hereinafter, embodiments of the present disclosure will be described in detail with reference to the accompanying drawings.

Figure 1:
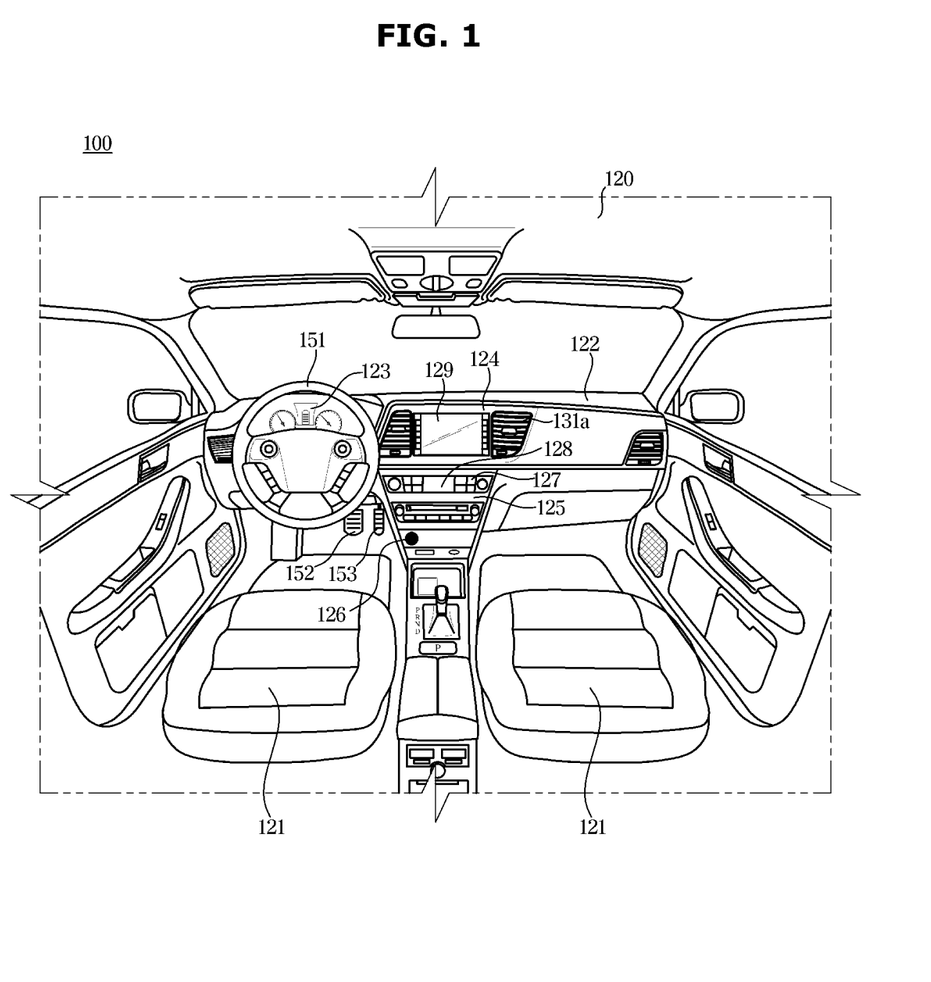
FIG. 1 shows an interior of a vehicle body of a vehicle according to an embodiment of the disclosure.
Figure 2:
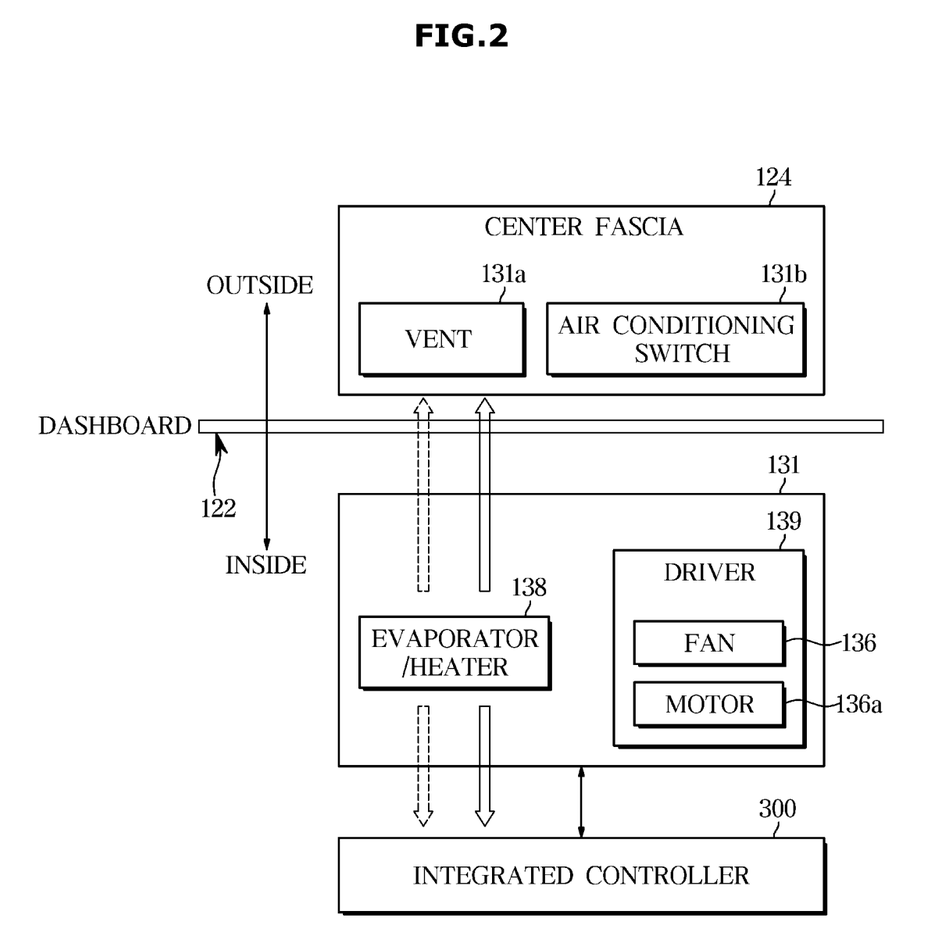
FIG. 2 is an exemplary view illustrating a positional relationship between an air conditioner and an integrated controller included in a vehicle according to an embodiment of the disclosure.

FIG. 1 shows an interior of a vehicle body of a vehicle according to an embodiment of the disclosure, and FIG. 2 is an exemplary view illustrating a positional relationship between an air conditioner and an integrated controller included in a vehicle according to an embodiment of the disclosure.

As illustrated in FIG. 1, an interior 120 of a vehicle body of a vehicle 100 may include a plurality of seats 121 in which passengers sit; a dash board 122; an instrument panel (that is, a cluster) 123 which is positioned on the dash board 122 and in which a tachometer, a speed meter, a cooling water thermometer, a fuel gauge, a turn signal indicator, a high beam indicator, an alarm lamp, a seat belt warning lamp, a trip odometer, an odometer, a shift lever indicator, an opening-of-door warning indicator, an engine oil alarm lamp, and a fuel shortage alarm lamp are arranged; a center fascia 124 in which a vent and control blades of an air conditioner are positioned; a head unit 125 positioned on the center fascia 124 and configured to receive commands for operating an audio system and the air conditioner; and a starter 126 configured to receive a start command.

The vehicle may further include a shift lever provided on the center fascia 124 and configured to receive an operation position, and a parking button (EPB button) located around the shift lever or on the head unit 125 and configured to receive an operation command of an electronic parking brake apparatus (not shown).

The vehicle 100 may further include an inputter 127 for receiving operation commands for various functions.

The inputter 127 may be provided on the head unit 125 and the center fascia 124, and may include at least one physical button, such as operation on/off buttons for various functions, buttons for changing setting values of the various functions, and the like.

The inputter 127 may further include a jog dial (not shown) or a touch pad (not shown) to enable a user to input commands for moving or selecting a cursor displayed on the display of a user interface 130.

Herein, the jog dial or the touch pad may be provided on the center fascia 124, and the like.

The vehicle 100 may further include a display 128 provided in the head unit 125, and configured to display information about a function being performed by the vehicle 100 and information input by the user.

The vehicle 100 may further include the user interface 129 for the user's convenience.

The user interface 129 may display information about a function being performed by the vehicle 100 and information input by the user.

The user interface 129 may also display information about the function being performed by the vehicle 100 and information input by the user.

The user interface 129 may be provided as a touch screen in which a touch panel and a display panel are integrated to perform both an input function and a display function. Also, the user interface 129 may be provided as a display panel to perform a display function. Accordingly, the user may make a touch input on the touch screen to select a desired function from among selectable functions displayed on the user interface 129.

An air conditioner 131 may be installed in the center fascia 124. The air conditioner 131 may adjust the inside temperature, humidity, air cleanliness, and air flow of the vehicle 100 to maintain the inside of the vehicle 100 pleasant. The air conditioner 131 may include at least one vent 131a installed in the center fascia 124 on an outer portion of the dashboard 122 and discharging air. In addition to the air conditioner 131, the center fascia 124 may further include an air conditioning switch 131b, such as a button or a dial, to enable the user to operate the air conditioner 131. Accordingly, the user such as a driver may control the air conditioner 131 by using the button disposed on the center fascia 124. Herein, the term driver is intended to include any individual in the vehicle, whether or not the individual is actually operating the vehicle.

The vehicle 100 may include various electronic devices in an inner space of the dashboard 122, that is, behind the center fascia 124 in which the vent 131a of the air conditioner 131 is positioned. FIG. 2 is a block diagram for describing a positional relationship between some components of the air conditioner 131 and an integrated controller 300 with an ADAS.

However, in the inner space of the dashboard 122 of the vehicle 100 illustrated in FIG. 2, other electronic devices may be further installed in addition to the air conditioner 131 and the integrated controller 300. For example, the integrated controller 300 may further include an additional air conditioning duct in the inner space of the dashboard 122 by branching an air conditioning duct connected to a center console installed between a driver's seat and a passenger's seat in the air conditioner 131 and coupling the branched air conditioning duct to the upper end of the integrated controller 300.

Figure 3:
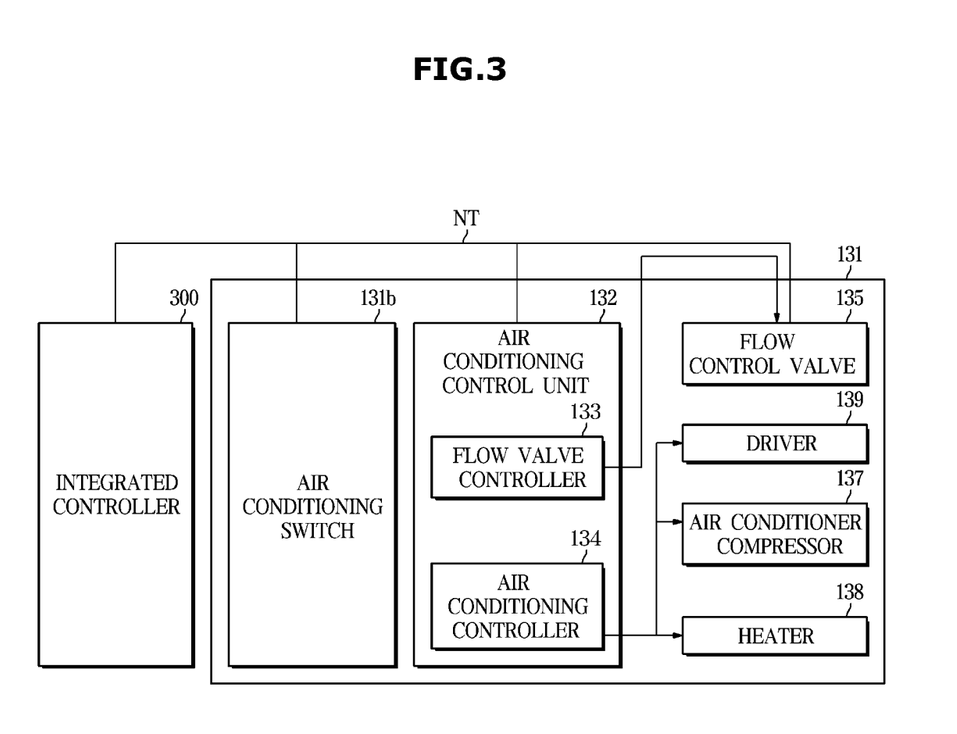
FIG. 3 is a block diagram illustrating a relationship between various electronic devices of a vehicle according to an embodiment of the disclosure.
Figure 4:
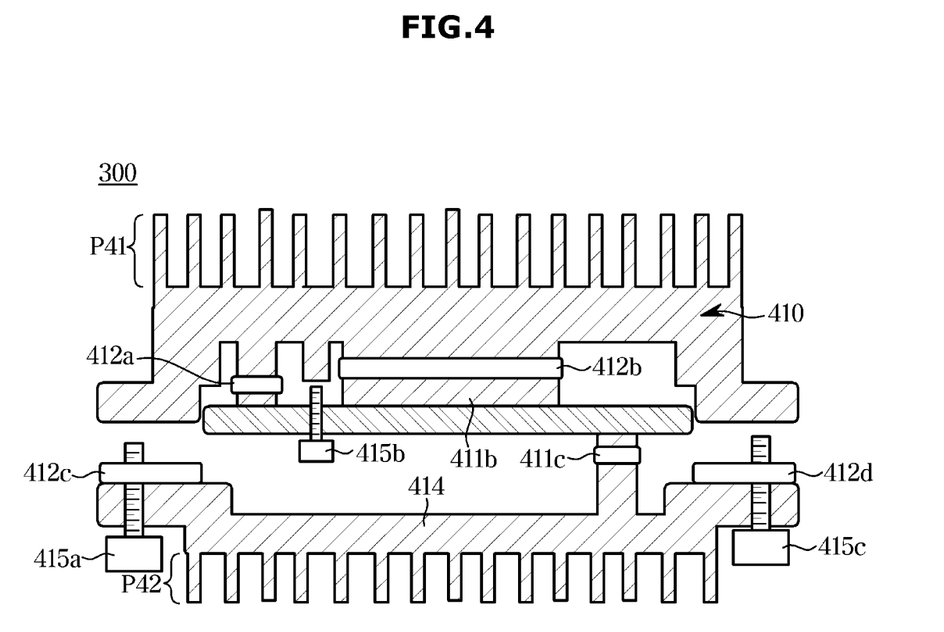
FIG. 4 is a side view of an integrated controller according to an embodiment of the disclosure.

Particularly, as illustrated in FIG. 2, the air conditioner 131 and the integrated controller 300 may be installed in the inner space of the dashboard 122. In FIG. 2, components for hardwarily operating the air conditioner 131 are illustrated. In FIG. 3, components of an air conditioning control unit 132 for softwarily operating the air conditioner 131 are illustrated in more detail. In FIG. 4, components constructing the integrated controller 300 are illustrated.

First, as illustrated in FIG. 2, the air conditioner 131 may include an evaporator/heater 138 for discharging air circulating to the vent 131a provided in the center fascia 124, and include a driver 139 that generates wind before the evaporator/heater 138 operates.

The driver 139 may include a fan 136 rotating by a motor 136a, and may generate wind when the fan 136 is driven.

The generated wind may be provided to the vent 131a or the integrated controller 300 through the evaporator/heater 138. The generated wind may pass through the vent 131a to be supplied to the inside of the vehicle 100.

More specifically, although not illustrated in the drawings, the air conditioner 131 may supply air to the integrated controller 300 because a part of the air conditioning duct connected to the center console of the vehicle 100 branches to the integrated controller 300.

At this time, the supplied air may be dehumidified air when the evaporator/heater 138 operates as an evaporator, and may be hot air when the evaporator/heater 138 operates as a heater.

More specifically, as illustrated in FIG. 3, the air conditioner 131 may include the air conditioning switch 131b, the air conditioning control unit 132, a flow control valve 135, the evaporator/heater 138, the driver 139, and an air conditioner compressor 137. The driver 139 may include the fan 136 and the motor 136a.

The air conditioning switch 131b, the air conditioning control unit 132, and the flow control valve 135 constituting the air conditioner 131 may communicate with each other through a vehicle network NT.

The air conditioning control unit 132 may also communicate with the integrated controller 300 through the vehicle network NT. Therefore, the air conditioning control unit 132 included in the air conditioner 131 may generate a control signal according to a signal received from the integrated controller 300.

The vehicle network NT may adopt a communication standard, such as Media Oriented Systems Transport (MOST) having communication speed of a maximum of 24.5 Mbps (Mega-bits per second), FlexRay having communication speed of a maximum of 10 Mbps, Controller Area Network (CAN) having communication speed from 125 kbps (kilo-bits per second) to 1 Mbps, and Local Interconnect Network (LIN) having communication speed of 20 kbps. The vehicle network NT may adopt one or more communication standards of MOST, FlexRay, CAN, and LIN.

In the air conditioner 131, the air conditioning switch 131b may enable a driver to adjust an amount of airflow, humidity, and a temperature to a desired level, as described above.

Therefore, the air conditioner 131 may include the air conditioning control unit 132 for operating the components of the air conditioner 131 based on information input by the driver through the air conditioning switch 131b. More specifically, the air conditioning control unit 132 may include a flow valve controller 133 for controlling the flow control valve 135 to adjust a flow rate according to a control signal, and an air conditioning controller 134 for adjusting an amount of air conditioning according to a control signal. The air conditioning control unit 132 may generate control signals for the flow valve controller 133 and the air conditioning controller 134 based on an input signal received from the integrated controller 300, in addition to information received from the driver through the air conditioning switch 131b.

The flow valve controller 133 may drive the flow control valve 135 through the vehicle network NT, and the air conditioning controller 134 may itself operate the driver 139 including the fan 136 and the motor 136a, the air conditioner compressor 137, and the evaporator/heater 138.

More specifically, the flow valve controller 133 may generate a control signal for driving the flow control valve 135, which is a valve for controlling a flow rate passing through the branched air duct to the integrated controller 300. The flow valve controller 133 may control an opening rate of the flow control valve 135 according to an amount of heat generated by the integrated controller 300.

For example, the integrated controller 300 may transfer a measured inside temperature to the air conditioner 131 through the vehicle network NT. At this time, the integrated controller 300 may transmit information about a heat capacity that needs to be dissipated in consideration of a reference temperature required for the integrated controller 300 to operate normally, to the air conditioner 131 through the vehicle network NT.

The air conditioning controller 134 of the air conditioner 131 may calculate a total heat capacity based on the information about the heat capacity received from the integrated controller 300 and an air conditioning setting value set by the driver through the air conditioning switch 131b.

Also, the air conditioning controller 134 may generate a signal for an opening rate required by the flow valve controller 133 based on the calculated total heat capacity, and transmit the generated signal for the opening rate to the flow control valve 135 through the vehicle network NT. The air conditioning controller 134 may transmit a vehicle air conditioning control signal to at least one of the driver 139, the air conditioner compressor 137, and the evaporator/heater 138.

For example, the air conditioning controller 134 may increase an opening rate of the flow control valve 135, when an amount of heat generation increases due to continuous operations of the integrated controller 300, and when additional heat dissipation is required, the air conditioning controller 134 may increase an operation amount of the air conditioner compressor 137.

Also, as an example, when a heat capacity that needs to be dissipated, received from the integrated controller 300, is small, the air conditioning controller 134 may reduce an opening rate of the flow control valve 135, thereby reducing cool air that is transmitted to the integrated controller 300.

As described above with reference to FIG. 2, the driver 139 may include the fan 136 rotating by the motor 136a, and when the fan 136 is driven, the air conditioner 131 may generate wind.

The generated wind may be provided to the vent 131a or the integrated controller 300 through the evaporator/heater 138, and pass through the vent 131a to be supplied to the inside of the vehicle 100.

The air conditioner compressor 137 may be a refrigerant compressor, and when the air conditioner compressor 137 is applied to the vehicle 100, the air conditioner compressor 137 may generally operate in the state in which a refrigerant and oil are mixed. That is, the air conditioner compressor 137 may convert rotation energy into reciprocating energy through a cylinder to compress a refrigerant, to decrease a temperature, and to generate cold wind through a heat exchanger.

Therefore, for example, when wind generated through the driver 139 is generated as cold wind through the air conditioner compressor 137 and then passes through the evaporator 138, the air conditioner 131 may provide air of low temperature and low humidity to a vehicle indoor environment of high temperature and high humidity in hot weather such as a summer.

The integrated controller 300, which receives air from the air conditioner 131, may have a structure as illustrated in FIG. 4.

FIG. 4 is a side view of the integrated controller 300 according to an embodiment of the disclosure. FIG. 4 illustrates the integrated controller 300 as a structure for covering a plurality of printed circuit boards (PCBs) 411a, 411b, and 411c with aluminum housings 410 and 414 configured with a plurality of heat dissipation fins.

The plurality of printed circuit boards 411a, 411b, and 411c may be configured by mounting a high-performance application processor (AP) or a field-programmable gate array (FPGA) on a conventional micro controller unit (MCU). This is because high-performance and high-speed operations are required when sensor fusion and deep-running image recognition technology are applied by mounting various sensors to operate the ADAS.

Therefore, in FIG. 4, the first printed circuit board 411a, the second printed circuit board 411b, and the third printed circuit board 411c may correspond to the MCU, the AP, and the FPGA chip, respectively. The printed circuit boards 411 (411a to 411c) may be high-heating elements, and generally designed to be in direct contact with the housings 410 and 414. At the upper end of each printed circuit board 411, a thermal grease 412 (412a to 412d) may be applied on bolt fastening portions 415 (415a to 415c) connecting the housings 410 and 414 to the printed circuit board 411 to improve heat transfer efficiency.

That is, the thermal grease 412 (412a to 412d) may be provided on at least a part of one surface of the at least one printed circuit board 411 and at least a part of the surfaces of the housings 410 and 414 to be positioned between the printed circuit board 411 and the housings 410 and 414.

The housings 410 and 414 may also include a cover housing 410 and a base housing 414.

The printed circuit board 411 may be disposed in the inside of at least one of the cover housing 410 and the base housing 414, and the thermal grease 412 may be provided between the printed circuit board 411 and the housings 410 and 414.

Heat dissipation fins P41 and P42 provided on the housings 410 and 414 may protrude from at least one upper surface of the cover housing 410 and from at least one lower surface of the base housing 414.

The integrated controller 300 of FIG. 4 may branch the air conditioning duct connected to the center console from the air conditioner 131 and fasten the air conditioning duct to the upper end of the integrated controller 300 in order to increase an heat dissipation effect by applying the heat dissipation fins P41 and P42 to the upper and lower housings 410 and 414. More specifically, at the upper end of the integrated controller 300, the flow control valve 135 of the air conditioner 131 may be positioned to control an amount of air that is transmitted to the integrated controller 300. This configuration will be described in detail in the following embodiment referring to FIGS. 5 and 7.

In addition, as will be described later with reference to FIG. 5, the integrated controller 300 may be positioned at the top of a chassis frame 310 of the vehicle 100 so that inside heat of the lower housing 414 of the integrated controller 300 is transferred to the chassis frame 310, and the chassis frame 310 and the integrated controller 300 may be cooled by convection caused by airflow in the lower portion of the vehicle 100 when the vehicle 100 is driven.

Figure 5:
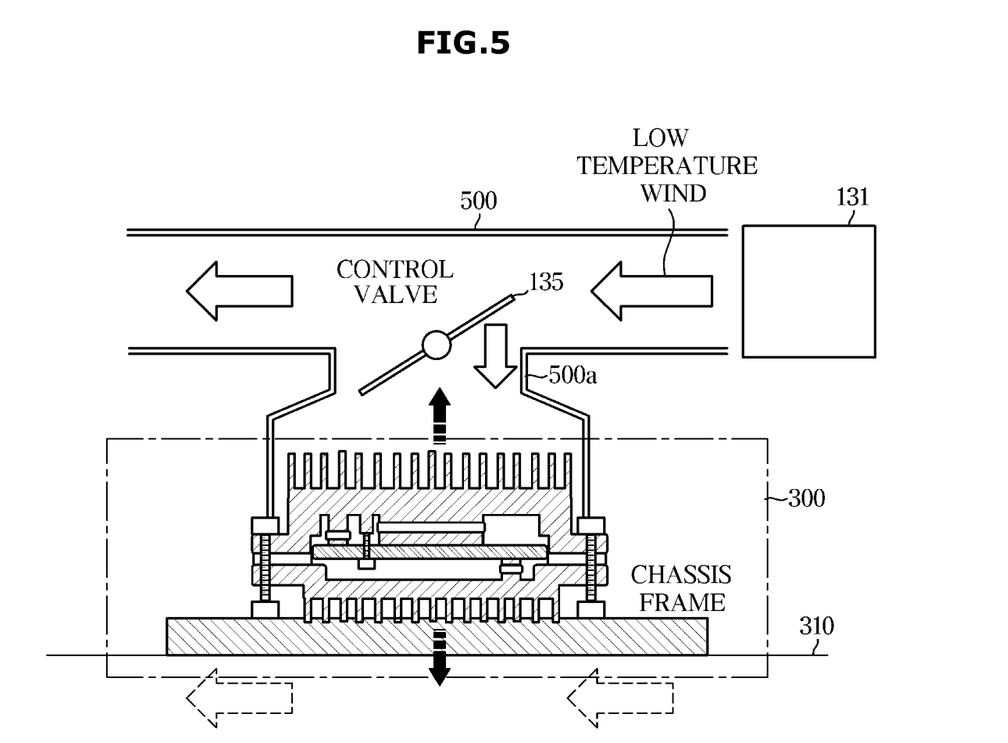
FIG. 5 is a schematic view for describing interactions between an air conditioner and an integrated controller according to an embodiment of the disclosure.
Figure 6:
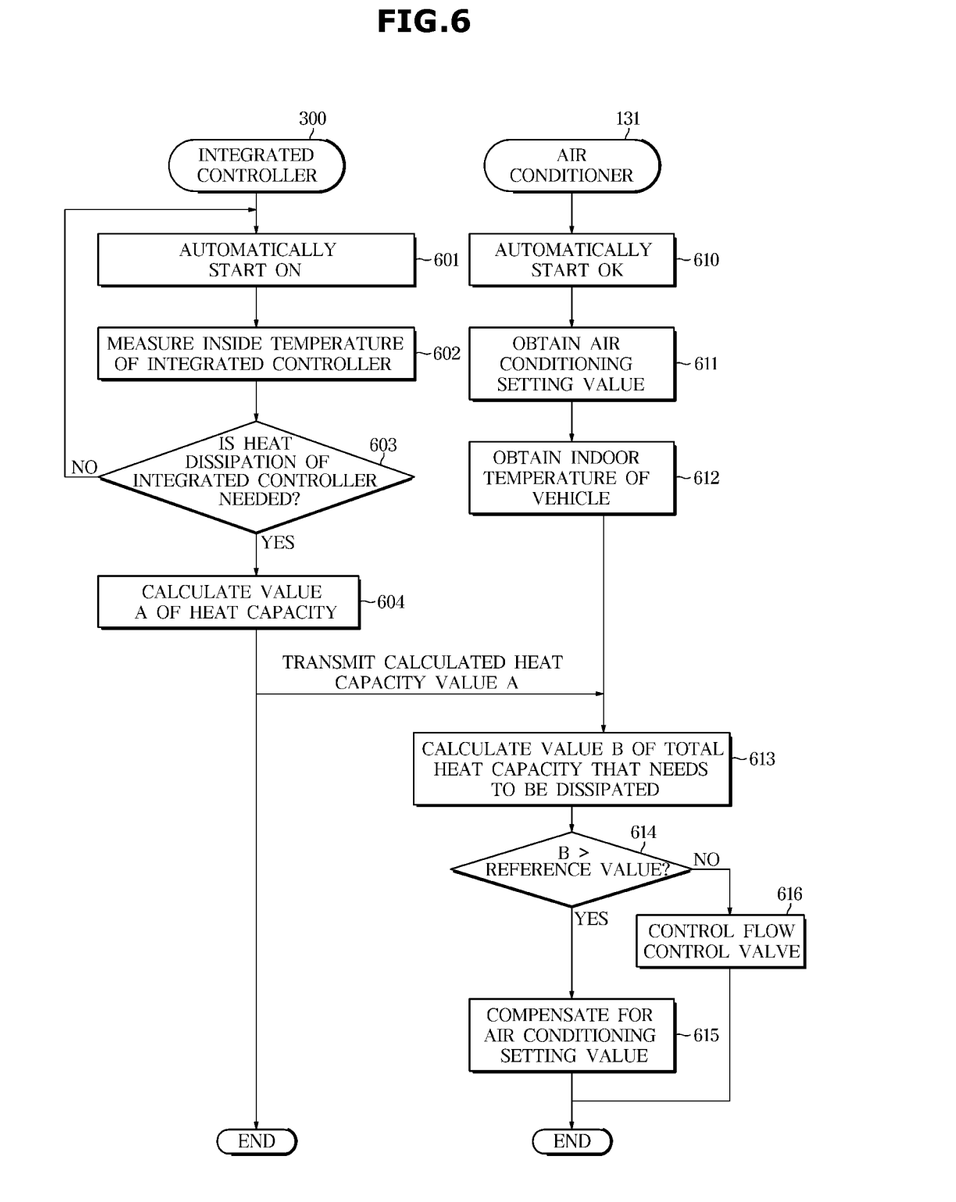
FIG. 6 is a flowchart illustrating a method of controlling a vehicle according to an embodiment of the disclosure.

More specifically, FIG. 5 is a schematic view for describing interactions between an air conditioner and an integrated controller according to an embodiment of the disclosure, and FIG. 6 is a flowchart illustrating a method for controlling a vehicle according to an embodiment of the disclosure. FIGS. 5 and 6 relate to an embodiment for optimizing the heat dissipation performance of the integrated controller 300 when the air conditioner 131 operates in summer.

For example, as illustrated in FIG. 5, the integrated controller 300 may be provided as a structure capable of receiving air from an air conditioning duct branched upward from the upper housing 410, and the flow control valve 135 for controlling an amount of air transmitted from the air conditioning duct may be located between the air conditioning duct and the integrated controller 300.

Accordingly, the flow control valve 135 may control an amount of air that is transmitted to the integrated controller 300 according to a control signal from the flow valve controller 133 of the air conditioning control unit 132.

In addition, the chassis frame 310 may be positioned at the lower end of the integrated controller 300, and the chassis frame 310 and the integrated controller 300 may be cooled by convection caused by airflow in the lower portion of the vehicle 100 when the vehicle 100 is driven.

At this time, the flow valve controller 133 for controlling the flow control valve 135 may control an opening rate of the flow control valve 135 based on an input signal input through the air conditioning switch 131*b* and temperature information of the integrated controller 300.

That is, FIG. 6 is a flowchart illustrating a vehicle control method for dissipating the heat of the integrated controller 300 by using the air conditioner 131 in summer.

First, the integrated controller 300 and the air conditioner 131 mounted on the vehicle 100 may start controlling the vehicle 100 according to the embodiment of the disclosure when the vehicle 100 starts, in operations 601 and 610.

The integrated controller 300 and the air conditioner 131 may be included in a separate vehicle and operate through the vehicle network NT. As illustrated in FIG. 6, the air conditioner 131 may receive information about a heat capacity that needs to be dissipated, calculated by the integrated controller 300, from the integrated controller 300.

The integrated controller 300 and the air conditioner 131 may operate independently in parallel. For convenience of description, an operation method of the integrated controller 300 will be first described as follows.

When the vehicle 100 starts in operation 601, the integrated controller 300 may measure an inside temperature of the integrated controller 300 configured with at least one chip, in operation 602. The first printed circuit board 411*a*, the second printed circuit board 411*b*, and the third printed circuit board 411*c* of the integrated controller 300 configured with at least one chip may be the MCU, the AP, and the FPGA chip, respectively. When the first printed circuit board 411*a* is a main printed circuit board, the first printed circuit board 411*a* may diagnose a chip temperature of the first printed circuit board 411*a*, a chip temperature of the second printed circuit board 411*b* received from the second printed circuit board 411*b*, and a chip temperature of the third printed circuit board 411*c* received from the third printed circuit board 411*c* to calculate a heat capacity A that needs to be dissipated, in consideration of a reference temperature at which the integrated controller 300 operates normally, in operation 604. At this time, the integrated controller 300 may determine whether heat dissipation is needed in consideration of the reference temperature at which the integrated controller 300 operates normally, in operation 603. Accordingly, when the integrated controller 300 determines that heat dissipation is needed (YES in operation 603), the integrated controller 300 may calculate a heat capacity A that needs to be dissipated, and transmit the calculated heat capacity A to the air conditioner 131.

Then, the air conditioner 131 may obtain an air conditioning setting value input by the driver through the air conditioning switch 131*b* when the vehicle 100 starts, in operation 611. At this time, the air conditioning setting value input by the driver may include an air volume and temperature information. In addition, the air conditioner 131 may obtain a vehicle indoor temperature to set an air conditioning value according to the air conditioning setting value, in operation 612.

The air conditioner 131, which has received the heat capacity A required for heat dissipation of the integrated controller 300 from the integrated controller 300, may calculate a total heat capacity B required for heat dissipation in consideration of both the air conditioning setting value and the heat capacity A, in operation 613. When the total heat capacity B is larger than a reference value which is a reference level allowing air-conditioning control with the air conditioning setting value set by the driver (YES in operation 614), the air conditioner 131 may compensate for the air conditioning setting value, in operation 615. For example, the air conditioner 131 may decrease the setting temperature, and increase the air volume.

In contrast, when the total heat capacity B is smaller than the reference value which is the reference level allowing vehicle air conditioning control with the air conditioning setting value set by the driver (NO in operation 614), the air conditioner 131 may control the flow control valve 135 to dissipate heat of the integrated controller 300. That is, the integrated controller 300 may open the flow control valve 135.

FIGS. 5 and 6 described above correspond to an embodiment for optimizing the heat dissipation performance of the integrated controller 300 in summer.

Figure 7:
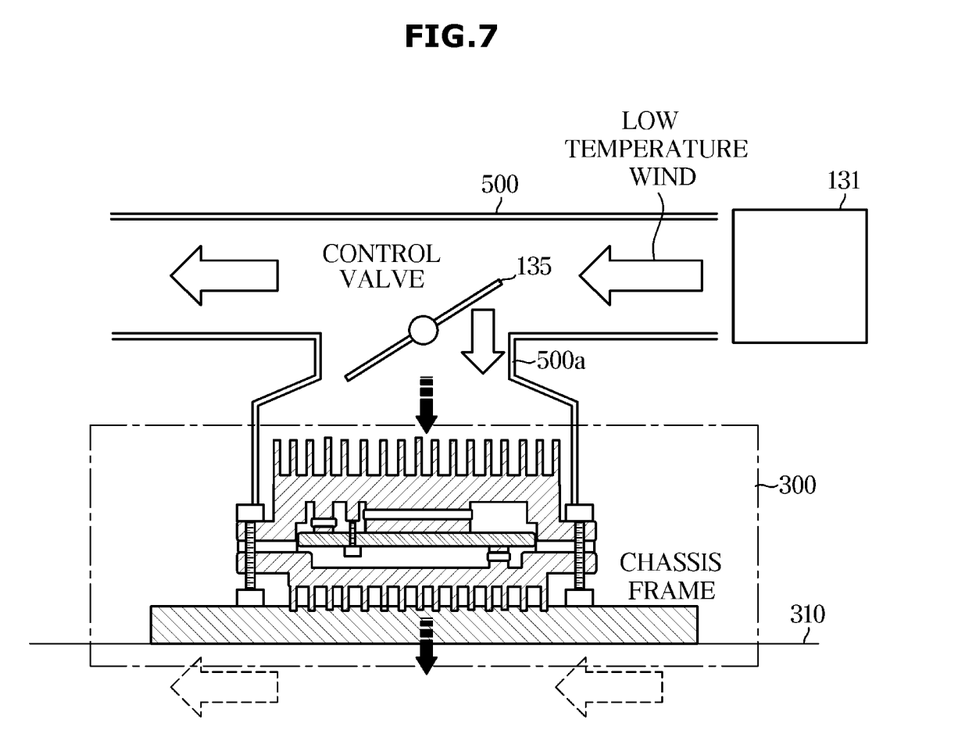
FIG. 7 is a schematic view for describing interactions between an air conditioner and an integrated controller according to another embodiment of the disclosure.
Figure 8:
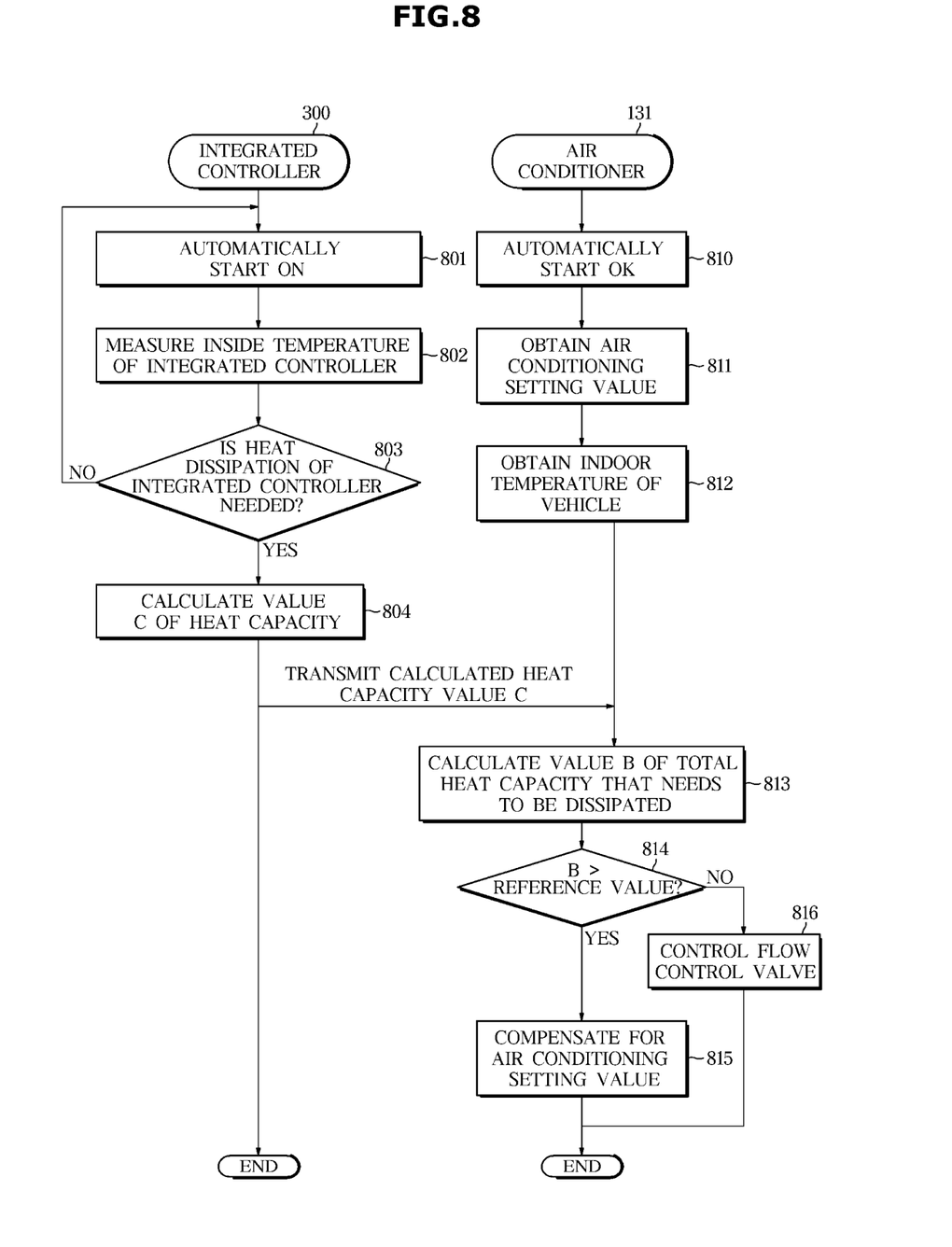
FIG. 8 is a flowchart illustrating a method of controlling a vehicle according to another embodiment of the disclosure.

FIGS. 7 and 8 illustrate a method of supplying heated air to prevent the temperature of the integrated controller 300 from falling excessively in winter.

For example, as illustrated in FIG. 7, which is the same as FIG. 5, the integrated controller 300 may be provided as a structure capable of receiving air from the air conditioning duct branched upward from the upper housing 410, and the flow control valve 135 for controlling an amount of air transmitted from the air conditioning duct may be positioned between the air conditioning duct and the integrated controller 300.

Thus, when air transmitted from the air conditioning duct is hot wind, the integrated controller 300 may absorb heat from the hot wind passing through the flow control valve 135.

Accordingly, the flow control valve 135 may control an amount of air that is transmitted to the integrated controller 300 according to a control signal from the flow valve controller 133 of the air conditioning control unit 132.

In addition, the chassis frame 310 may be positioned below the integrated controller 300, and accordingly, when the vehicle 100 is driven, heat of the chassis frame 310 and the integrated controller 300 may be dissipated by convection caused by airflow in the lower portion of the vehicle 100.

At this time, the flow valve controller 133 for controlling the flow control valve 135 may control an opening rate of the flow control valve 135 based on an input signal input through the air conditioning switch 131*b* and temperature information of the integrated controller 300.

That is, FIG. 8 is a flowchart illustrating a vehicle control method for preventing the temperature of the integrated controller 300 from falling excessively by using the air conditioner 131 in winter.

First, the integrated controller 300 and the air conditioner 131 mounted on the vehicle 100 may start controlling the vehicle 100 according to an embodiment of the disclosure when the vehicle 100 starts, in operations 801 and 810.

The integrated controller 300 and the air conditioner 131 may be included in a separate vehicle and operate through the vehicle network NT. As illustrated in FIG. 6, the air conditioner 131 may receive a value of a heat capacity that needs to be dissipated, calculated by the integrated controller 300, from the integrated controller 300.

The integrated controller 300 and the air conditioner 131 may operate independently in parallel. For convenience of description, an operation method of the integrated controller 300 will be first described as follows.

When the vehicle 100 starts in operation 801, the integrated controller 300 may measure an inside temperature of the integrated controller 300 configured with at least one chip, in operation 802. Herein, the first printed circuit board 411*a*, the second printed circuit board 411*b*, and the third printed circuit board 411*c* of the integrated controller 300 configured with at least one chip may correspond to the MCU, the AP, and the FPGA chip, respectively. When the first printed circuit board 411*a* is a main printed circuit board, the first printed circuit board 411*a* may diagnose a chip temperature of the first printed circuit board 411*a*, a chip temperature of the second printed circuit board 411*b* received from the second printed circuit board 411*b*, and a chip temperature of the third printed circuit board 411*c* received from the third printed circuit board 411*c* to calculate a heat capacity value C for heat absorption in consideration of a reference temperature at which the integrated controller 300 operates normally, in operation 804. At this time, the integrated controller 300 may determine whether heat absorption is needed, in consideration of a predetermined normal operation temperature of the integrated controller 300 as a reference value, in operation 803. Accordingly, when the integrated controller 300 determines that the heat absorption is needed (YES in operation 803), the integrated controller 300 may calculate the heat capacity value C for the heat absorption and transmit the calculated heat capacity value C to the air conditioner 131.

Then, when the vehicle 100 starts, the air conditioner 131 may obtain an air conditioning setting value input by the driver through the air conditioning switch 131*b*, in operation 811. The air conditioning setting value input by the driver may include an air volume and temperature information. In addition, the air conditioner 131 may obtain a vehicle indoor temperature to set an air conditioning value according to the air conditioning setting value, in operation 812.

The air conditioner 131 that has receives the required heat capacity value C of the integrated controller 300 from the integrated controller 300 may calculate a total heat capacity B that needs to be dissipated, in consideration of both the air conditioning setting value and the heat capacity value C, in operation 813. When the total heat capacity B is larger than a reference value which is a reference level allowing air-conditioning control with the air conditioning setting value set by the driver (YES in operation 814), the air conditioner 131 may compensate for the air conditioning setting value, in operation 815. For example, the air conditioner 131 may decrease the setting temperature, and increase the air volume, thereby discharging hot wind.

In contrast, when the total heat capacity B is smaller than the reference value which is the reference level allowing air conditioning control with the air conditioning setting value set by the driver (NO in operation 814), the air conditioner 131 may control the flow control valve 135 to dissipate heat of the integrated controller 300. That is, the integrated controller 300 may open the flow control valve 135.

That is, a case in which the integrated controller 300 is frozen in winter so as not to operate properly may be prevented in advance, as seen from FIG. 8.

Figure 9:
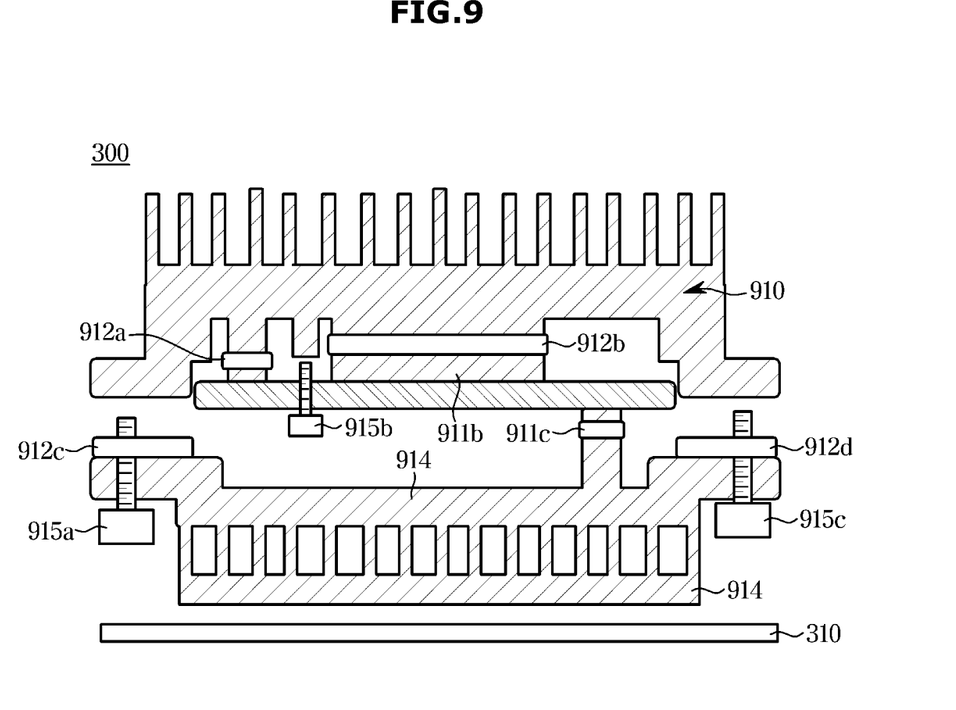
FIG. 9 is a side view of an integrated controller according to another embodiment of the disclosure.

FIG. 9 is a side view of an integrated controller according to another embodiment of the disclosure. In the case of an integrated controller 300 illustrated in FIG. 9, the integrated controller 300 may have a structure of covering a plurality of printed circuit boards (PCBs) 911*a*, 911*b* and 911*c* with aluminum housings 910 and 914 configured with a plurality of heat dissipation fins, like the integrated controller 300 shown in FIG. 4.

The plurality of printed circuit boards 911*a*, 911*b*, and 911*c* may be configured by mounting a high performance AP or a high performance FPGA on a MCU. This is because high-performance and high-speed operations are required when sensor fusion and deep-running image recognition technology are applied by mounting various sensors to operate the ADAS.

However, as shown in FIG. 9, in the lower housing 914, lower ends of the heat dissipation fins may be flat to maximize thermal conduction with the chassis frame 310.

As is apparent from the above description, the vehicle for reducing the heat generation of the integrated controller equipped with the ADAS, and the method of controlling the vehicle may be provided.

Further, the vehicle for preventing the temperature of the integrated controller equipped with the ADAS from falling excessively, and the method of controlling the vehicle may be provided.

Further, the integrated controller equipped with the ADAS, the ADAS mounted on the vehicle, may be provided as a structure that is operable in such a way not to be sensitive to an external temperature.

The exemplary embodiments of the present disclosure have thus far been described with reference to accompanying drawings. It will be obvious to people of ordinary skill in the art that the present disclosure may be practiced in other forms than the exemplary embodiments as described above without changing the technical idea or essential features of the present disclosure. The above exemplary embodiments are only by way of example, and should not be interpreted in a limited sense.

What is claimed is:

1. An integrated controller equipped with an advanced driver assistance system (ADAS) of a vehicle, the integrated controller comprising:
   at least one printed circuit board;
   a housing of a heat dissipation fin structure positioned to surround the at least one printed circuit board;
   a thermal grease provided on at least a part of a surface of the at least one printed circuit board and at least a part of a surface of the housing; and
   a bolt fastening portion connecting the at least one printed circuit board to the housing, wherein the thermal grease is applied on the bolt fastening portion connecting the housing and to the printed circuit board,
   wherein the integrated controller is configured to:
   measure a temperature of the integrated controller;

calculate a value of a heat capacity that needs to be dissipated when it is determined that heat dissipation of the integrated controller is needed; and transmit the calculated value of the heat capacity to an air conditioner, wherein an air conditioning controller is configured to receive the value of the heat capacity calculated by the integrated controller and to calculate a final heat capacity value based on the received value of the heat capacity and an air conditioning control value received from a driver.

2. The integrated controller according to claim 1, wherein the housing comprises a cover housing and a base housing;

wherein the printed circuit board is positioned in an inside cover of the housing or the base housing; and wherein the thermal grease is positioned between the printed circuit board and the housing.

3. The integrated controller according to claim 2, wherein the heat dissipation fin structure protrudes from at least one surface of an upper portion of the cover housing, and protrudes from at least one surface of a lower portion of the base housing.

4. The vehicle, comprising:

the integrated controller according to claim 1; and the air conditioner, configured to introduce air into an inside of the vehicle and to adjust a flow of the air, wherein the air conditioner is configured to transmit the air to the integrated controller by branching an air conditioning duct that is a passage for transmitting air into the inside of the vehicle.

5. The vehicle according to claim 1, wherein the air conditioner further comprises an air conditioning switch configured to receive the air conditioning control value from the driver, a flow control valve configured to adjust an amount of air that is transmitted to the integrated controller, and the air conditioning controller configured to control the flow control valve.

6. The vehicle according to claim 1, wherein the air conditioning controller is configured to compensate for the air conditioning control value when the final heat capacity value is larger than a reference value, and to open a flow control valve when the final heat capacity value is smaller than the reference value.

7. The vehicle according to claim 6, wherein the reference value is the air conditioning control value received from the driver and is a threshold value allowing internal air conditioning control of the vehicle.

8. The vehicle according to claim 7, wherein the air conditioning control value further comprises a setting temperature set by the driver or a setting air volume set by the driver, wherein the air conditioning controller is configured to decrease the setting temperature or to increase the setting air volume when the final heat capacity value is larger than the reference value.

9. The vehicle according to claim 4, wherein the air conditioner is configured to transmit cooled air or heated air to the integrated controller by branching the air conditioning duct that is the passage for transmitting air into the inside of the vehicle.

10. The vehicle according to claim 9, wherein the integrated controller is configured to calculate the value of the heat capacity required for heating and to transmit the calculated value of the heat capacity to the air conditioner when it is determined that heating of the integrated controller is needed.

11. The vehicle according to claim 10, wherein the air conditioner is configured to calculate the final heat capacity value based on the received value of the heat capacity and the air conditioning control value, and to heat the air conditioner based on the final heat capacity value.

12. An integrated controller equipped with an advanced driver assistance system (ADAS) of a vehicle, the integrated controller comprising:

at least one printed circuit board;

a housing of a heat dissipation fin structure positioned to surround the at least one printed circuit board;

a thermal grease positioned between the printed circuit board and the housing; and a bolt fastening portion connecting the at least one printed circuit board to the housing, wherein the thermal grease is applied on the bolt fastening portion connecting the housing and to the printed circuit board, wherein the integrated controller is configured to:

measure a temperature of the integrated controller;

calculate a value of a heat capacity that needs to be dissipated when it is determined that heat dissipation of the integrated controller is needed; and transmit the calculated value of the heat capacity to an air conditioner, wherein an air conditioning controller is configured to receive the value of the heat capacity calculated by the integrated controller and to calculate a final heat capacity value based on the received value of the heat capacity and an air conditioning control value received from a driver.

13. The integrated controller according to claim 12, wherein the housing comprises a cover housing and a base housing, and wherein the printed circuit board is positioned inside the cover housing.

14. The integrated controller according to claim 12, wherein the housing comprises a cover housing and a base housing, and wherein the printed circuit board is positioned inside the base housing.

15. The integrated controller according to claim 12, wherein the thermal grease contacts both a surface of the at least one printed circuit board and a surface of the housing.

16. The integrated controller according to claim 12, wherein the housing comprises a cover housing and a base housing and wherein the heat dissipation fin structure protrudes from a surface of an upper portion of the cover housing and also from a surface of a lower portion of the base housing.

17. The vehicle comprising:

the integrated controller according to claim 14; and the air conditioner, configured to introduce air into an inside of the vehicle and to adjust a flow of the air, wherein the air conditioner is configured to transmit the air to the integrated controller by branching an air conditioning duct that is a passage for transmitting air into the inside of the vehicle.

18. A vehicle comprising:

an integrated controller comprising at least one printed circuit board, a housing of a heat dissipation fin structure positioned to surround the at least one printed circuit board, a thermal grease provided on at least a part of a surface of the at least one printed circuit board and at least a part of a surface of the housing, and a bolt fastening portion connecting the at least one printed circuit board to the housing;

an air conditioner configured to introduce air into an inside of the vehicle and to adjust a flow of the air, wherein the air conditioner is configured to transmit the air to the integrated controller by branching an air conditioning duct that is a passage for transmitting air into the inside of the vehicle; and an air conditioning controller;

wherein the integrated controller is configured to measure a temperature of the integrated controller, to calculate a value of a heat capacity that needs to be dissipated when it is determined that heat dissipation of the integrated controller is needed, and to transmit the calculated value of the heat capacity to the air conditioner; and wherein the air conditioning controller is configured to receive the value of the heat capacity calculated by the integrated controller and to calculate a final heat capacity value based on the received value of the heat capacity and an air conditioning control value received from a driver.

* * * * *

UNITED STATES PATENT AND TRADEMARK OFFICE
CERTIFICATE OF CORRECTION

PATENT NO. : 12,178,016 B2
APPLICATION NO. : 18/146838
DATED : December 24, 2024
INVENTOR(S) : Park et al.

It is certified that error appears in the above-identified patent and that said Letters Patent is hereby corrected as shown below:

In the Claims

In Column 14, in Claim 17, Line 48, delete "claim 14;" and insert -- claim 12; --.

Signed and Sealed this
Eleventh Day of February, 2025

Coke Morgan Stewart
*Acting Director of the United States Patent and Trademark Office*